United States Patent
Ahn et al.

(10) Patent No.: US 9,355,706 B2
(45) Date of Patent: May 31, 2016

(54) OUTPUT CIRCUIT FOR IMPLEMENTING HIGH SPEED DATA TRANSMITION

(71) Applicant: SAMSUNG ELECTRONICS CO., LTD., Suwon-si, Gyeonggi-do (KR)

(72) Inventors: Minsu Ahn, Suwon-si (KR); Seungjun Bae, Hwaseong-si (KR); Joon-Young Park, Seoul (KR); Yoon-Joo Eom, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 14/322,129

(22) Filed: Jul. 2, 2014

(65) Prior Publication Data

US 2015/0036448 A1 Feb. 5, 2015

Related U.S. Application Data

(60) Provisional application No. 61/860,930, filed on Aug. 1, 2013.

(30) Foreign Application Priority Data

Oct. 31, 2013 (KR) .................. 10-2013-0131340

(51) Int. Cl.
  *G11C 7/10* (2006.01)
  *G11C 11/4076* (2006.01)
  *G11C 7/02* (2006.01)
  *G11C 7/22* (2006.01)
  *G11C 11/4093* (2006.01)

(52) U.S. Cl.
  CPC .............. *G11C 11/4076* (2013.01); *G11C 7/02* (2013.01); *G11C 7/1066* (2013.01); *G11C 7/222* (2013.01); *G11C 11/4093* (2013.01)

(58) Field of Classification Search
  CPC .. G11C 11/4076; G11C 11/4093; G11C 7/02; G11C 7/1066; G11C 7/222
  See application file for complete search history.

(56) References Cited

U.S. PATENT DOCUMENTS

| | | | |
|---|---|---|---|
| 5,512,845 A | 4/1996 | Yuh | |
| 5,867,049 A * | 2/1999 | Mohd | H03K 3/356104 327/200 |
| 6,493,394 B2 | 12/2002 | Tamura et al. | |
| 7,102,952 B2 | 9/2006 | Lee et al. | |
| 8,009,485 B2 | 8/2011 | Bae | |
| 8,144,527 B2 | 3/2012 | Bae et al. | |
| 8,305,819 B2 | 11/2012 | Kim et al. | |
| 2002/0047725 A1 * | 4/2002 | Moon | H03K 17/145 326/42 |
| 2004/0128601 A1 * | 7/2004 | Muljono | G01R 31/31716 714/734 |
| 2009/0244994 A1 * | 10/2009 | Kim | G11C 7/1051 365/193 |
| 2012/0021713 A1 | 1/2012 | Mikhemar et al. | |

FOREIGN PATENT DOCUMENTS

| | | |
|---|---|---|
| KR | 10-2001-0002117 A | 1/2001 |
| KR | 10-2010-0076806 A | 7/2010 |

* cited by examiner

*Primary Examiner* — Khamdan Alrobaie
(74) *Attorney, Agent, or Firm* — Volentine & Whitt, PLLC

(57) ABSTRACT

An output circuit includes first and second output drivers. The first output driver is configured to transfer a first data signal directly to an output pad in synchronization with a clock signal. The second output driver is configured to transfer a second data signal directly to the output pad in synchronization with an inversion clock signal. The clock signal and the inversion clock enable multiplexing of the first data signal and the second data signal to provide a multiplexed output data signal.

20 Claims, 11 Drawing Sheets

Fig. 4
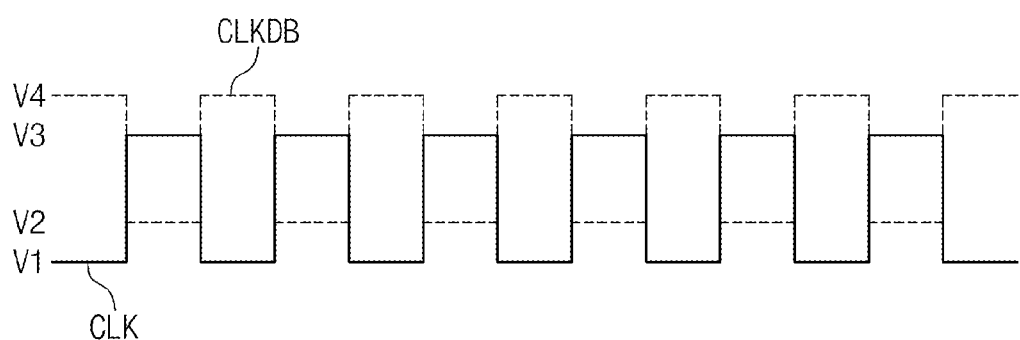
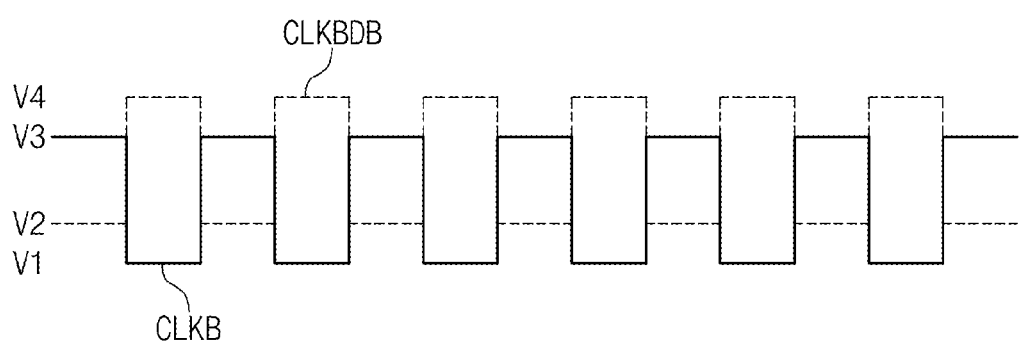

OUTPUT CIRCUIT FOR IMPLEMENTING HIGH SPEED DATA TRANSMITION

CROSS-REFERENCE TO RELATED APPLICATIONS

A claim for priority under 35 U.S.C. §119 is made to U.S. Provisional Patent Application No. 61/860,930 filed Aug. 1, 2013, and Korean Patent Application No. 10-2013-0131340 filed Oct. 31, 2013, in the Korean Intellectual Property Office, the entire contents of both of which are hereby incorporated by reference.

BACKGROUND

Embodiments of the inventive concept described herein relate to a semiconductor memory device, and more particularly, to an output circuit for high-speed data transfer.

A semiconductor memory device may have an output driver to an internal signal to an external device. A general output driver may have a PMOS transistor and an NMOS transistor that are connected in series between a power line and a ground line.

In general, a synchronous dynamic random access memory (SDRAM) may operate in a single data rate (SDR) technique, in which one unit of data is input and output during one period of a clock in synchronization with a rising edge of a system clock. However, an increase in data input/output speed may be required according to an increase in frequency of the system clock. For this, there may be proposed a double data rate (DDR) technique according to which data is input and output in synchronization with rising and falling edges of the system clock, respectively. The DDR technique may enable data to be transferred at high speeds without increasing internal operation frequency. Also, in recent years, a low power DDR (LPDDR) technique has been proposed that enables data to be transferred at higher speed using less power. However, with the conventional LPDDR techniques, the period for high-speed data transfer of multiple data signals to output pads may be relatively long. Therefore, when the system clock frequency increases, inter-symbol interference of the data likewise increases.

SUMMARY

An aspect of the inventive concept provides an output circuit including first and second output drivers. The first output driver is configured to transfer a first data signal directly to an output pad in synchronization with a clock signal. The second output driver is configured to transfer a second data signal directly to the output pad in synchronization with an inversion clock signal. The clock signal and the inversion clock enable multiplexing of the first data signal and the second data signal to provide a multiplexed output data signal.

Each of the first data signal and the second data signal may have a transfer frequency lower than a frequency of each of the clock signal and the inversion clock signal, respectively.

The first output driver may include a first transistor configured to transfer the first data signal to the output pad in synchronization with the clock signal, and the second output driver may include a second transistor configured to transfer the second data signal to the output pad in synchronization with the inversion clock signal. The first and second transistors may multiplex the first data signal and the second data signal in synchronization with the clock signal and the inversion clock signal. Each of the first and second transistors may include an NMOS transistor.

The first output driver may include a first low voltage threshold (LVT) NMOS transistor configured to be turned on and off according to the clock signal; a PMOS transistor configured to be selectively turned on according to the first data signal to transfer a power supply voltage to the first LVT NMOS transistor; and an NMOS transistor configured to be selectively turned on according to the first data signal to transfer a ground voltage to the first LVT NMOS transistor. The first LVT NMOS transistor may include a source, connected to a drain of the PMOS transistor and a drain of the NMOS transistor, and a drain connected to the output pad. A threshold voltage of the first LVT NMOS transistor may be lower than a threshold voltage of the NMOS transistor.

The second output driver may include a second LVT NMOS transistor configured to be turned on and off according to the inversion clock signal, a PMOS transistor configured to be selectively turned on according to the second data signal to transfer a power supply voltage to the second LVT NMOS transistor, and an NMOS transistor configured to be selectively turned on according to the second data signal to transfer a ground voltage to the second LVT NMOS transistor. The second LVT NMOS transistor may include a source, connected to a drain of the PMOS transistor and a drain of the NMOS transistor, and a drain connected to the output pad. A threshold voltage of the second LVT NMOS transistor may be lower than a threshold voltage of the NMOS transistor.

Another aspect of the inventive concept provides an output circuit including first and second output drivers, and first and second clock boosting circuits. The first output driver is configured to transfer a first data signal directly to an output pad in synchronization with a boosting clock signal. The second output driver is configured to transfer a second data signal directly to the output pad in synchronization with a boosting inversion clock signal. The first clock boosting circuit is configured to convert a clock signal into the boosting clock signal using a first boosting capacitor. The second clock boosting circuit is configured to convert an inversion clock signal into the boosting inversion clock signal using a second boosting capacitor. The boosting clock signal and the boosting inversion clock signal enable multiplexing of the first data signal and the second data signal to provide a multiplexed output data signal.

The first clock boosting circuit may include a first NMOS transistor connected in parallel with the first boosting capacitor, and the boosting clock signal may be boosted to be higher than the clock signal by a threshold voltage of the first NMOS transistor. The first NMOS transistor may have a source connected to a node of the first boosting capacitor to which the clock signal is provided and a gate and a drain connected to a node of the first boosting capacitor from which the boosting clock signal is output.

The second clock boosting circuit may include a second NMOS transistor connected in parallel with the second boosting capacitor, and the boosting inversion clock signal may be boosted to be higher than the inversion clock signal by a threshold voltage of the second NMOS transistor. The second NMOS transistor may have a source connected to a node of the second boosting capacitor to which the inversion clock signal is provided and a gate and a drain connected to a node of the second boosting capacitor from which the boosting inversion clock signal is output.

Each of the first data signal and the second data signal may have a transfer frequency lower than a frequency of each of the boosting clock signal and the boosting inversion clock signal, respectively.

The first output driver may include a first LVT NMOS transistor configured to transfer the first data signal to the output pad in synchronization with the boosting clock signal. Also, the second output driver may include a second LVT NMOS transistor configured to transfer the second data signal to the output pad in synchronization with the boosting inversion clock signal.

Another aspect of the inventive concept provides an output circuit including first and second output drivers. The first output driver includes a first transistor configured to be turned on and off according to a clock signal, a second transistor configured to selectively transfer a first voltage to the first transistor according to a first data signal, and a third transistor configured to selectively transfer a second voltage to the first transistor according to the first data signal. The second output driver includes a fourth transistor configured to be turned on and off according to an inversion clock signal, a fifth transistor configured to selectively transfer the first voltage to the fourth transistor according to a second data signal, and a sixth transistor configured to selectively transfer the second voltage to the fourth transistor according to the second data signal. Outputs of the first and fourth transistors are connected to provide a multiplexed output data signal including the first and second data signals.

Each of the first and second data signals may have a transfer frequency lower than a frequency of each of the clock signal and the inversion clock signal, respectively.

The output circuit may further include an output pad connected to the first and fourth transistors, and configured to receive the multiplexed output data signal. The output pad may enable connection to another device.

Also, the output circuit may further include first and second clock boosting circuits. The first clock boosting circuit may be configured to convert the clock signal into a boosting clock signal using a first boosting capacitor. The second clock boosting circuit may be configured to convert the inversion clock signal into a boosting inversion clock signal using a second boosting capacitor. The first and fourth transistors are configured to be turned on and off according to the boosting clock signal and the boosting inversion clock signal, respectively.

BRIEF DESCRIPTION OF THE FIGURES

Exemplary embodiments of the inventive concept will be more clearly understood from the following description taken in conjunction with the accompanying drawings, wherein like reference numerals refer to like parts throughout the various figures unless otherwise specified, and in which:

FIG. 4 is a timing diagram showing input and output signals of the clock boosting circuits shown in FIG. 3, according to an embodiment of the inventive concept;

DETAILED DESCRIPTION

Figure 1:
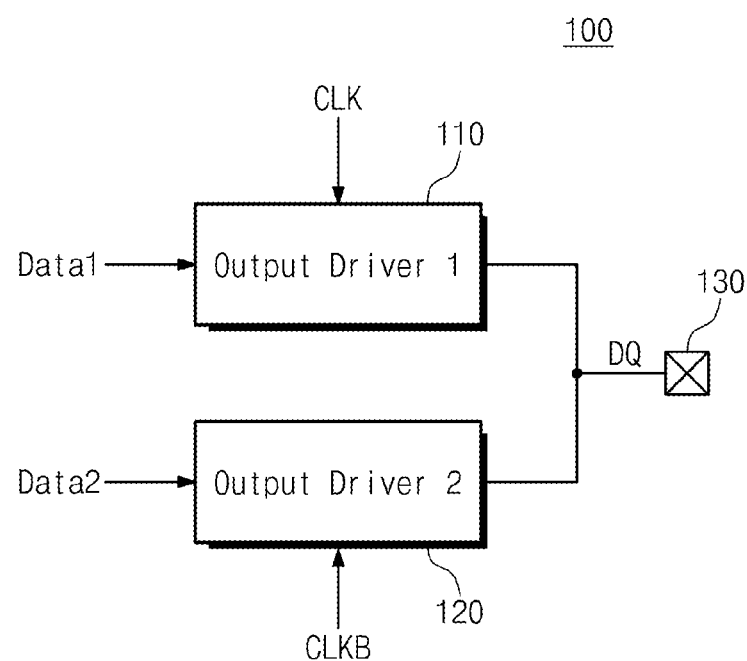
FIG. 1 is a block diagram schematically illustrating an output circuit, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may be repeated. In the drawings, sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an output circuit according to an embodiment of the inventive concept. Referring to FIG. 1, an output circuit 100 includes a first output driver 110 and a second output driver 120. The first output driver 110 receives first data signal Data1, and outputs the first data signal Data1 thus received in synchronization with a clock signal CLK. The second output driver 120 receives second data signal Data2, and outputs the second data signal Data2 thus received in synchronization with an inversion clock signal CLKB. The clock signal CLK may be a pulse signal having a constant frequency, and the inversion clock signal CLKB may be an inverted pulse signal (with an inverted shape of the pulse signal) having the same frequency as the clock signal CLK. Thus, the first data signal Data1 and the second data signal Data2 may be multiplexed by the clock signal CLK and the inversion clock signal CLKB. An output data signal DQ is generated by multiplexing the first data signal Data1 and the second data signal Data2.

The frequency of the output data signal DQ may be the same as the frequency of the clock signal CLK and the inversion clock signal CLKB. The output data signal DQ is transferred through a channel, connected to an output pad 130, to another device (not shown). Thus, the first output driver 110 is configured to transfer the first data signal Data1 directly to the output pad 130 in synchronization with the clock signal CLK, and the second output driver 120 is configured to transfer the second data signal Data2 directly to the output pad 130 in synchronization with the inversion clock signal CLKB, for multiplexing. The channel provides a data path for transferring data, and may be implemented by lines or a bus. For example, the lines or the bus may be formed on or in a printed circuit board (PCB). The data path may include an electrical path or an optical path. When the data path includes an optical path, it may include an optical interconnection means, such as optical fiber, an optical waveguide, or other medium transferring an optical signal, for example.

Transfer speeds of the first data signal Data1 and the second data signal Data2 may be slower than those of the clock signal CLK and the inversion clock signal CLKB. For example, each of the clock signal CLK and the inversion clock signal CLKB may have a transfer speed of about 6.4 Gbps, and each of the first data signal Data1 and the second data signal Data2 may have a transfer speed of about 3.2 Gbps. In general, each of the clock signal CLK and the inversion clock signal CLKB may iteratively have logical "0" or logical "1," so inter-symbol interference may not be generated even though the clock signal CLK and the inversion clock signal CLKB are transferred at high speed. However, each of the first data signal Data1 and the second data signal Data2 may include logical "0" or "1" randomly, so inter-symbol interference may be generated when the first data signal Data1 and the second data signal Data2 are transferred at high speed. When the high-speed transfer period becomes longer, the likelihood of the first data signal Data1 and/or the second data signal Data2 becoming erroneous increases. When the first data signal Data1 and the second data signal Data2 transferred at low speed are multiplexed at a front stage of the output pad 130, the inter-symbol interference of the output data signal DQ is thus reduced.

Figure 2:
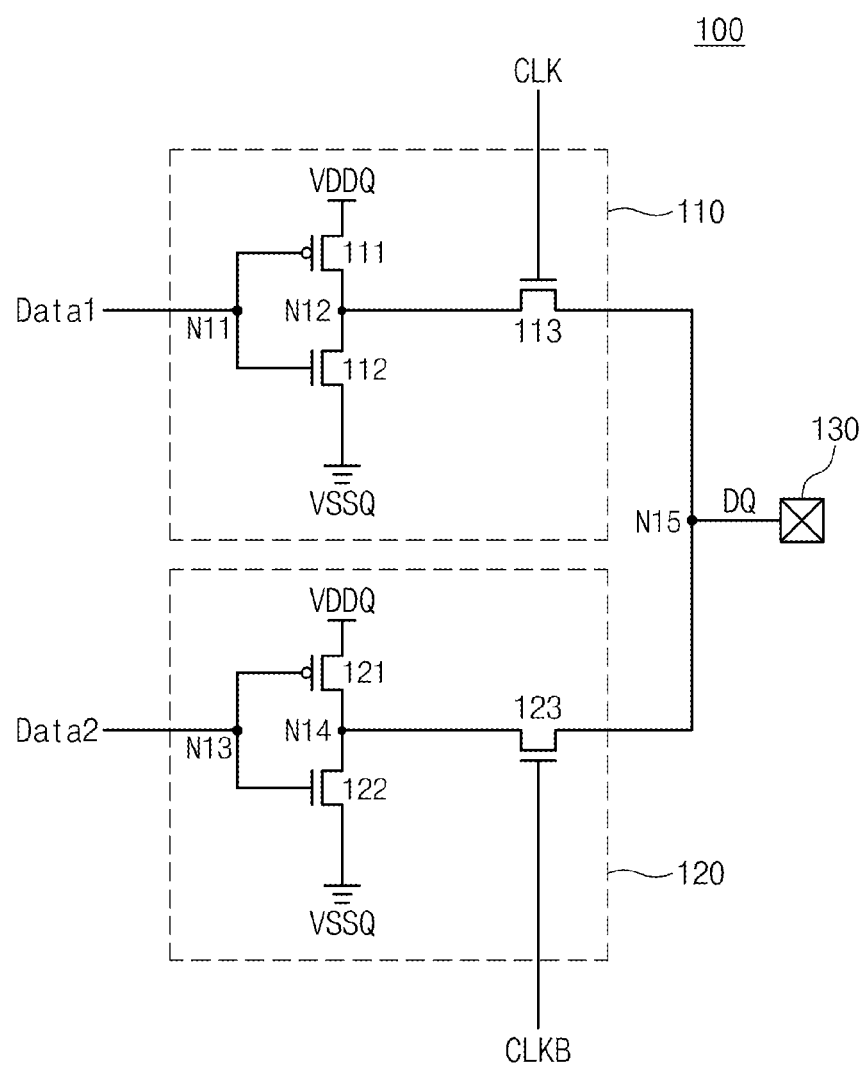
FIG. 2 is a circuit diagram schematically illustrating an output circuit shown in FIG. 1, according to an embodiment of the inventive concept.

FIG. 2 is a circuit diagram schematically illustrating an output circuit shown in FIG. 1, according to an embodiment of the inventive concept. Referring to FIG. 2, the output circuit 100 transfers through the output pad 130 an output data signal DQ generated by multiplexing the first data signal Data1 and the second data signal Data2.

In the depicted embodiment, the first output driver 110 includes a PMOS transistor 111, an NMOS transistor 112, and an NMOS transistor 113. The first data signal Data1 is provided to gates of the PMOS and NMOS transistors 111 and 112 through a node N11. The PMOS and NMOS transistors 111 and 112 are connected in series between a power supply voltage (VDDQ) terminal and a ground voltage (VSSQ) terminal A source of the PMOS transistor 111 is connected to the power supply voltage (VDDQ) terminal, and a source of the NMOS transistor 112 is connected to the ground voltage (VSSQ) terminal. A drain of the PMOS transistor 111 and a drain of the NMOS transistor 112 are connected to a node N12. A source of an NMOS transistor 113 is connected to the node N12, and a drain of the NMOS transistor 113 is connected to a node N15. The node N15 is connected to the output pad 130.

Also in the depicted embodiment, the second output driver 120 includes a PMOS transistor 121 and NMOS transistors 122 and 123. The second data signal Data2 is provided to gates of the PMOS and NMOS transistors 121 and 122 through a node N13. The PMOS and NMOS transistors 121 and 122 are in series between the power supply voltage (VDDQ) terminal and the ground voltage (VSSQ) terminal. A source of the PMOS transistor 121 is connected to the power supply voltage (VDDQ) terminal, and a source of the NMOS transistor 122 is connected to the ground voltage (VSSQ) terminal. A drain of the PMOS transistor 121 and a drain of the NMOS transistor 122 are connected to a node N14. A source of an NMOS transistor 123 is connected to the node N14, and a drain of the NMOS transistor 113 is connected to the node N15.

The signal at the node N12 may be an inverted version of the first data signal Data1. For example, when the first data signal Data1 has a logical "0" value, the only the PMOS transistor 111 is turned on, so the signal at the node N12 has a logical "1" value. When the first data signal Data1 has a logical "1" value, only the NMOS transistor 112 is only turned on, so the signal at the node N12 has a logical "0" value. The signal at the node N12 may be transferred to the node N15 through the NMOS transistor 113, which is turned on and off according to the clock signal CLK. Thus, the signal at the node N12 may be transferred to the node N15 according to the frequency of the clock signal CLK.

Similarly, the signal at the node N14 may be an inverted version of second data signal Data2. For example, when the second data signal Data2 has a logical "0" value, only the PMOS transistor 121 is turned on, so the signal at the node N14 has a logical "1" value. When the second data signal Data2 has a logical "0" value, only the NMOS transistor 122 is turned on, so the signal at the node N14 has a logical "0" value. The signal at the node N14 may be transferred to the node N15 through the NMOS transistor 123 to the node N15, which is turned on and off according to the inversion clock signal CLKB. Thus, the signal at the node N14 may be transferred to the node N15 according to the frequency of the inversion clock signal CLKB.

Since a pulse waveform of the clock signal CLK is opposite to that of the inversion clock signal CLKB, the first data signal Data1 and the second data signal Data2 may be multiplexed by the NMOS transistors 113 and 123. As a result of the multiplexing, the output data signal DQ is output through the output pad 130. The frequency of the output data signal DQ may be the same as those of the clock signals CLK and CLKB. The transfer speeds of the first data signal Data1 and the second data signal Data2 may be slower than those of the clock signal CLK and the inversion clock signal CLKB. For example, each of the clock signal CLK and the inversion clock signal CLKB may have a transfer speed of about 6.4 Gbps, and each of the first data signal Data1 and the second data signal Data2 may have a transfer speed of about 3.2 Gbps. Therefore, the output circuit 100 may receive each of the first data signal Data1 and the second data signal Data2 at a transfer speed of about 3.2 Gbps, and may output the output data signal DQ multiplexed at a transfer speed of about 6.4 Gbps. As shown, the output circuit 100 multiplexes the first data signal Data1 and the second data signal Data2 at a front stage of the output pad 130, so a high-speed transfer period of the output data signal DQ is shortened, thereby reducing the inter-symbol interference of the output data signal DQ.

Figure 3:
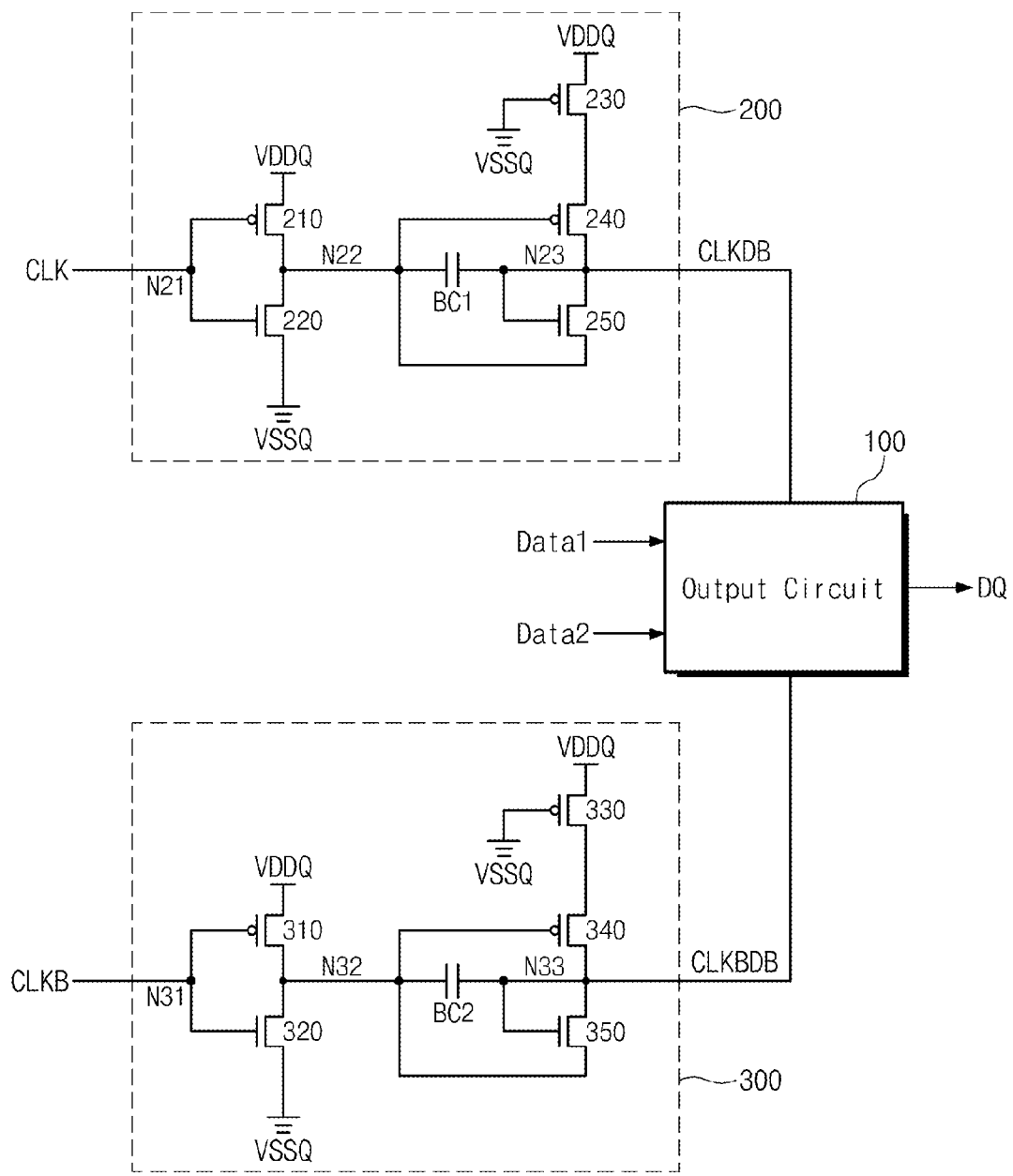
FIG. 3 is a circuit diagram showing a clock boosting circuit for the output circuit, according to an embodiment of the inventive concept.

FIG. 3 is a circuit diagram showing a clock boosting circuit, according to another embodiment of the inventive concept. Referring to FIG. 3, a first clock boosting circuit 200 converts a clock signal CLK into a boosting clock signal CLKDB, and transfers the boosting clock signal CLKDB to an output circuit 100. The first clock boosting circuit 200 includes a first boosting capacitor BC1. A second clock boosting circuit 300 converts an inversion clock signal CLKB into a boosting inversion clock signal CLKBDB, and transfers the boosting inversion clock signal CLKBDB to the output circuit 100. The second clock boosting circuit 300 includes a second boosting capacitor BC2.

The first clock boosting circuit 200 further includes PMOS transistors 210, 230, and 240 and NMOS transistors 220 and 250. The clock signal CLK is provided through a node N21 to gates of the PMOS and NMOS transistors 210 and 220. The PMOS and NMOS transistors 210 and 220 are connected in series between a power supply voltage (VDDQ) terminal and a ground voltage (VSSQ) terminal. A source of the PMOS transistor 210 is connected to the power supply voltage (VDDQ) terminal, and a source of the NMOS transistor 220 is connected to the ground voltage (VSSQ) terminal. A drain of the PMOS transistor 210 and a drain of the NMOS transistor 220 are connected to a node N22. A gate of the PMOS transistor 230 is connected to the ground voltage (VSSQ) terminal A source of the PMOS transistor 230 is connected to the power supply voltage (VDDQ) terminal A drain of the PMOS transistor 230 is connected to a source of the PMOS transistor 240. A gate of the PMOS transistor 240 is connected to the node N22. A drain of the PMOS transistor 240 is connected to a node N23.

Also, the first boosting capacitor BC1 is connected between the node N22 and the node N23, and the NMOS transistor 250 is connected in parallel with the first boosting capacitor BC1. That is, a source of the NMOS transistor 250 is connected to the node N22 and a drain of the NMOS transistor 2250 is connected to the node N23. A gate of the NMOS transistor 250 is also connected to the node N23. The boosting clock signal CLKDB is output through the node N23. The boosting clock signal CLKDB is boosted to be higher than the clock signal CLK by approximately a threshold voltage of the NMOS transistor 250.

In the depicted example, when the clock signal CLK has a logical "1" value, a signal at the node N22 has a logical "0" value, so the PMOS transistor 240 is turned on. When the PMOS transistor 240 is turned on, the NMOS transistor 250 may act as a diode. Thus, a voltage value of the boosting clock signal CLKDB may be higher by a threshold voltage of the NMOS transistor 250 than that of the clock signal CLK having a logical "0" value. At this time, the PMOS transistor 230 may act as a current source that supplies a small quantity of current to the PMOS transistor 240.

For example, when the clock signal CLK has a logical "0" value, a signal at the node N22 has a logical "1" value, so the PMOS transistor 240 is turned off. When the PMOS transistor 240 is turned off, the NMOS transistor 250 is turned off. Thus, the first boosting capacitor BC1 makes a voltage value of the boosting clock signal CLKDB higher by the threshold voltage of the NMOS transistor 250 than that of the clock signal CLK having a logical "1" value. The reason is that when the clock signal CLK has a logical "1" value, the node N23 maintains a voltage value higher by a threshold voltage of the NMOS transistor 250 than that of the clock signal CLK having a logical "0" value as a boosting result of the first boosting capacitor BC1. As a result, the first clock boosting circuit 200 inverts the clock signal CLK and outputs the boosting clock signal CLKDB boosted by a threshold voltage of the NMOS transistor 250.

Similarly, the second clock boosting circuit 300 includes PMOS transistors 310, 330 and 340 and NMOS transistors 320 and 350. The inversion clock signal CLKB is provided through a node N31 to gates of the PMOS and NMOS transistors 310 and 320. The PMOS and NMOS transistors 310 and 320 are connected in series between the power supply voltage (VDDQ) terminal and the ground voltage (VSSQ) terminal. A source of the PMOS transistor 310 is connected to the power supply voltage (VDDQ) terminal, and a source of the NMOS transistor 320 is connected to the ground voltage (VSSQ) terminal. A drain of the PMOS transistor 310 and a drain of the NMOS transistor 320 are connected to a node N32. A gate of the PMOS transistor 330 is connected to the ground voltage (VSSQ) terminal A source of the PMOS transistor 330 is connected to the power supply voltage (VDDQ) terminal. A drain of the PMOS transistor 330 is connected to a source of the PMOS transistor 340. A gate of the PMOS transistor 340 is connected to the node N32. A drain of the PMOS transistor 340 is connected to a node N33.

Also, the second boosting capacitor BC2 is connected between the node N32 and the node N33, and the NMOS transistor 350 is connected in parallel with the second boosting capacitor BC2. That is, a source of the NMOS transistor 350 is connected to the node N32 and a drain of the NMOS transistor 350 is connected to the node N33. A gate of the NMOS transistor 350 is also connected to the node N33. The boosting inversion clock signal CLKBDB is output through the node N33. The boosting inversion clock signal CLKBDB is boosted to be higher than the inversion clock signal CLKB by approximately a threshold voltage of the NMOS transistor 350.

For example, when the inversion clock signal CLKB has a logical "1" value, a signal at the node N32 has a logical "0" value, so the PMOS transistor 340 is turned on. When the PMOS transistor 340 is turned on, the NMOS transistor 350 may act as a diode. Thus, a voltage value of the boosting inversion clock signal CLKBDB may be higher by the threshold voltage of the NMOS transistor 350 than that of the inversion clock signal CLKB having a logical "0" value. At this time, the PMOS transistor 330 may act as a current source that supplies a small quantity of current to the PMOS transistor 340.

When the inversion clock signal CLKB has a logical "0" value, a signal at the node N32 has a logical "1" value, so the PMOS transistor 340 is turned off. When the PMOS transistor 340 is turned off, the NMOS transistor 350 is turned off. The second boosting capacitor BC2 makes a voltage value of the boosting inversion clock signal CLKBDB higher by a threshold voltage of the NMOS transistor 350 than that of the inversion clock signal CLKB having a logical "1" value. The reason is that when the inversion clock signal CLKB has a logical "1" value, the node N33 maintains a voltage value higher by a threshold voltage of the NMOS transistor 350 than that of the inversion clock signal CLKB having a logical "0" value as a boosting result of the second boosting capacitor BC2. As a result, the second clock boosting circuit 300 inverts the inversion clock signal CLKB and outputs the boosting inversion clock signal CLKBDB boosted by a threshold voltage of the NMOS transistor 350.

FIG. 4 is a timing diagram showing input and output signals of clock boosting circuits shown in FIG. 3, according to an embodiment of the inventive concept. Referring to FIGS. 3 and 4, a clock signal CLK swinging between V1 and V3 is provided to the first clock boosting circuit 200. For example, V1 may be 0V, and V3 may be 1V. The clock signal CLK is inverted and boosted by the first clock boosting circuit 200, so as to be converted into the boosting clock signal CLKDB. The boosting clock signal CLKDB may be a pulse signal that swings between V2 and V4. For example, V2 may be 0.3V, and V4 may be 1.3V. Thus, the boosting clock signal CLKDB may be a pulse signal boosted by 0.3V as compared with the clock signal CLK. The boosting clock signal CLKDB is provided to the gate of the NMOS transistor 113 (refer to FIG. 2) of the output circuit 100. When using the boosting clock signal CLKDB, which has a voltage level higher than that of the clock signal CLK, the operation speed of the NMOS transistor 113 may be improved. Also, when using the boosting clock signal CLKDB, which has a voltage level higher than that of the clock signal CLK, the size of the NMOS transistor 113 may be reduced.

An inversion clock signal CLKB swinging between V1 and V3 is provided to the second clock boosting circuit 300. For example, V1 may be 0V, and V3 may be 1V. The inversion clock signal CLKB is inverted and boosted by the second clock boosting circuit 300 so as to be converted into a boosting inversion clock signal CLKBDB. The boosting inversion clock signal CLKBDB may be a pulse signal that swings between V2 and V4. For example, V2 may be 0.3V, and V4 may be 1.3V. Thus, the boosting inversion clock signal CLKBDB may be a pulse signal boosted by 0.3V as compared with the inversion clock signal CLKB. The boosting inversion clock signal CLKBDB is provided to a gate of an NMOS transistor 123 of the output circuit 100. When using the boosting inversion clock signal CLKBDB, having a voltage level higher than that of the inversion clock signal CLKB, the operation speed of the NMOS transistor 123 is improved. Also, when using the boosting inversion clock signal CLKBDB the voltage level of which is higher than that of the inversion clock signal CLKB, the size of the NMOS transistor 123 may be reduced.

Figure 5:
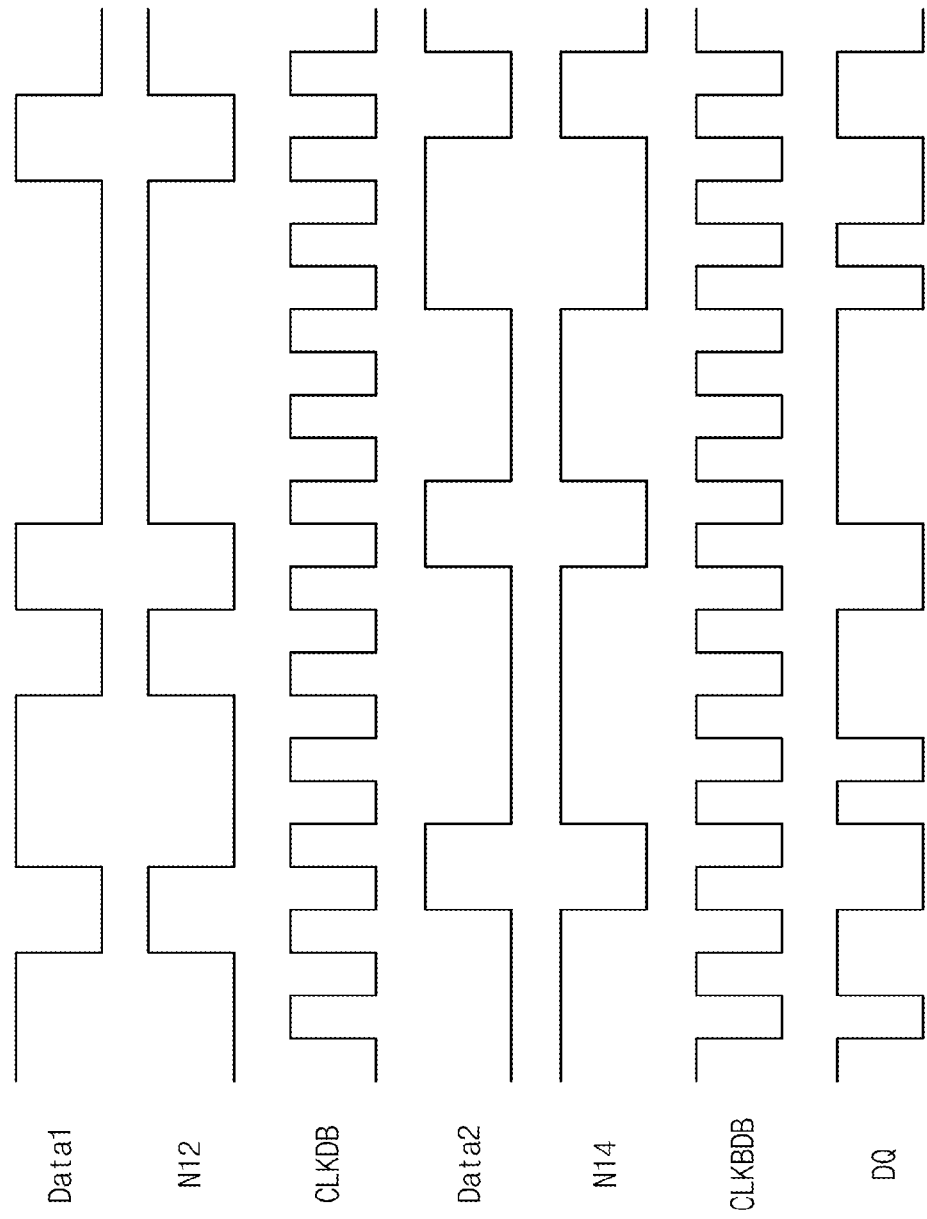
FIG. 5 is a timing diagram showing input and output signals of an output circuit shown in FIG. 3, according to an embodiment of the inventive concept.

FIG. 5 is a timing diagram showing input and output signals of an output circuit shown in FIG. 3, according to an embodiment of the inventive concept. Referring to FIGS. 2, 3 and 5, transfer speeds of first data signal Data1 and second data signal Data2 are slower than those of a boosting clock signal CLKDB and a boosting inversion clock signal CLKBDB. For example, the boosting clock signal CLKDB and the boosting inversion clock signal CLKBDB may be transferred at a speed of about 6.4 Gbps, and the first data signal Data1 and the second data signal Data2 may be transferred at in a speed of about 3.2 Gbps.

The first data signal Data1 is provided to the first output driver 110. A signal at the node N12 is an inverted version of first data signal Data1. The clock signal CLK may be converted into a boosting clock signal CLKDB, and the boosting clock signal CLKDB may be provided to the gate of an NMOS transistor 113. The boosting clock signal CLKDB may be a signal that periodically has a logical "0" value and a logical "1" value.

The second data signal Data2 is provided to the second output driver 120. A signal at the node N14 is an inverted version of second data signal Data2. The inversion clock signal CLKB may be converted into a boosting inversion clock signal CLKBDB, and the boosting inversion clock signal CLKBDB may be provided to the gate of an NMOS transistor 123. The boosting inversion clock signal CLKBDB may a signal that periodically has a logical "0" value and a logical "1" value. The boosting inversion clock signal CLKBDB is an inverted version of the boosting clock signal CLKDB.

The output data signal DQ is multiplexed and output by the NMOS transistors 113 and 123. When a signal at the node N12 and the boosting clock signal CLKDB have a logical "1" value, the output data signal DQ may have a logical "1" value. When a signal at the node N14 and the boosting inversion clock signal CLKBDB have a logical "1" value, the output data signal DQ has a logical "1" value. When either a signal at the node N12 or the boosting clock signal CLKDB has a logical "0" value and either a signal at the node N14 or the boosting inversion clock signal CLKBDB have a logical "0" value, the output data signal DQ has a logical "0" value. As a result, the first data signal Data1 and the second data signal Data2 may be multiplexed such that they are converted into the output data signal DQ having the same transfer speed as the clock signals CLKDB and CLKBDB. For example, the output data signal DQ may be transferred at a speed of about 6.4 Gbps. That is, when the first and second data signals Data1 and Data2 having transfer speeds of about 3.2 Gbps are multiplexed at a front stage of the output pad 130, the period during which the output data signal DQ is transferred (at a speed of about 6.4 Gbps) is shortened. Thus, it is possible to reduce the inter-symbol interference of the output data signal DQ.

Figure 6:
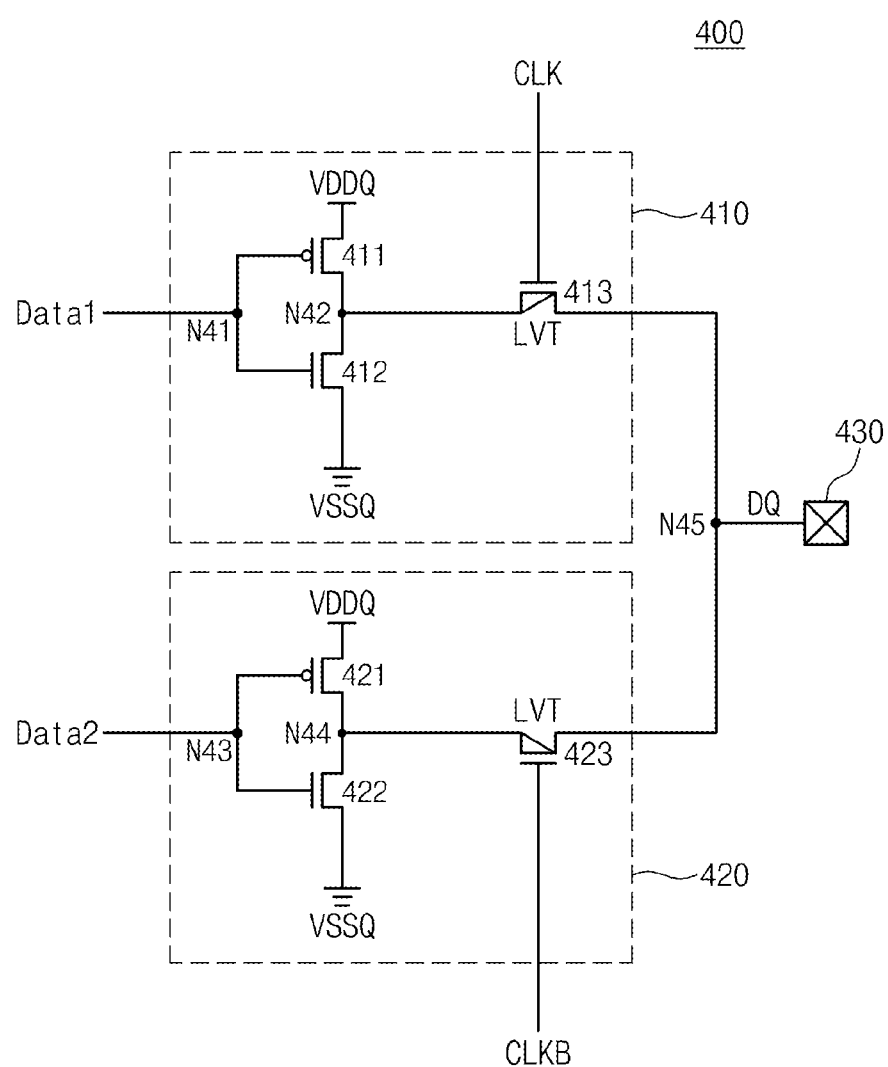
FIG. 6 is a circuit diagram schematically illustrating an output circuit, according to another embodiment of the inventive concepts.

FIG. 6 is a circuit diagram schematically illustrating an output circuit, according to another embodiment of the inventive concept. Referring to FIG. 6, an output circuit 400 has substantially the same structure as the output circuit 100 shown in FIG. 2, described above. However, NMOS transistors 413 and 423 in FIG. 6 are low voltage threshold (LVT) transistors. Generally, an LVT transistor has a threshold voltage lower than that of a general transistor. For example, the threshold voltages of the NMOS transistors 413 and 423 marked by "LVT" may be lower by about 50 mV to about 100 mV than the threshold voltages of the transistors 113 and 123 shown in FIG. 2, as well as the threshold voltages of transistors 411, 412, 421 and 422, respectively.

A signal at a node N42 is an inverted version of the first data signal Data1. When the first data signal Data1 has a logical "0" value, only the PMOS transistor 411 is turned on, so the signal at the node N42 has a logical "1" value. When the first data signal Data1 has a logical "1" value, one the NMOS transistor 412 is turned on, so the signal at the node N42 has a logical "0" value. The signal at the node N42 is transferred through the LVT NMOS transistor 413 to a node N45. The LVT NMOS transistor 413 is turned on and off according to a clock signal CLK. The switching operation of the LVT NMOS transistor 413 is fast. The signal at the node N42 is transferred to the node N45 according to a frequency of the clock signal CLK.

A signal at a node N44 is an inverted version of the second data signal Data2. Similarly, when the second data signal Data2 has a logical "0" value, only the PMOS transistor 421 is turned on, so the signal at the node N44 has a logical "1" value. When the second data signal Data2 has a logical "1" value, only the NMOS transistor 422 is turned on, so the signal at the node N44 has a logical "0" value. The signal at the node N44 is transferred through the LVT NMOS transistor 423 to the node N45. The LVT NMOS transistor 423 is turned on and off according to an inversion clock signal CLKB. The switching operation of the LVT NMOS transistor 423 is fast. The signal at the node N44 is transferred to the node N45 according to a frequency of the inversion clock signal CLKB.

A pulse waveform of the clock signal CLK is opposite to that of the inversion clock signal CLKB. Thus, the first data signal Data1 and the second data signal Data2 are multiplexed by the NMOS transistor 413 and the NMOS transistor 423, providing a multiplexed output data signal DQ, which is output through an output pad 430. A frequency of the output data signal DQ may be equal to the frequency of the clock signals CLK and CLKB.

Transfer speeds of the first data signal Data1 and the second data signal Data2 are slower than those of the clock signal CLK and the inversion clock signal CLKB. For example, the first data signal Data1 and the second data signal Data2 may be transferred at a speed of about 3.2 Gbps, and the clock signal CLK and the inversion clock signal CLKB may be transferred at a speed of about 6.4 Gbps. The output circuit 400 may receive the first data signal Data1 and the second data signal Data2, and output the multiplexed output data signal DQ at about 6.4 Gbps. The output circuit 400 may multiplex the first data signal Data1 and the second data signal Data2 at a front stage of the output pad 130, so a high-speed transfer period of the output data signal DQ is shortened. This may mean that the inter-symbol interference of the output data signal DQ is reduced.

Figure 7:
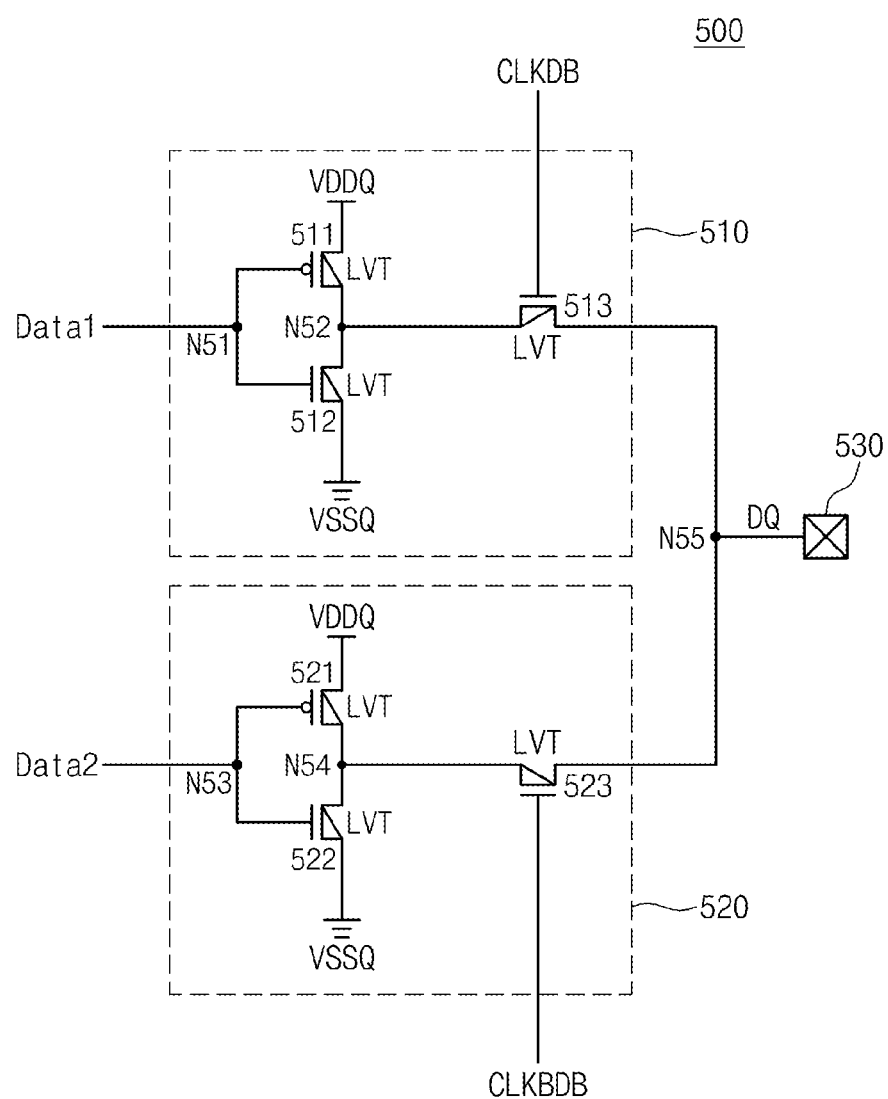
FIG. 7 is a circuit diagram schematically illustrating an output circuit, according to another embodiment of the inventive concepts.

FIG. 7 is a circuit diagram schematically illustrating an output circuit, according to still another embodiment of the inventive concept. Referring to FIG. 7, an output circuit 500 has substantially the same structure as the output circuit 100 shown in FIG. 2. However, each of PMOS transistors 511 and 521, and NMOS transistors 512, 513, 522 and 523, are LVT transistors. Generally, an LVT transistor has a threshold voltage lower than that of a general transistor. For example, threshold voltages of the transistors 511, 512, 513, 521, 522 and 523 marked by "LVT" may be lower by about 50 mV to about 100 mV than the threshold voltages of transistors 111, 112, 113, 121, 122, and 123 shown in FIG. 2, respectively.

Also, a boosting clock signal CLKDB boosted by the clock boosting circuit 200 shown in FIG. 3 may be provided to a gate of the LVT NMOS transistor 513, and a boosting inversion clock signal CLKBDB boosted by the clock boosting circuit 300 shown in FIG. 3 may be provided to a gate of the LVT NMOS transistor 523. Thus, the LVT NMOS transistors 513 and 523 may operate at fast switching speeds. Also, the size of the LVT NMOS transistors 513 and 523 may be scaled down. As a result, input capacitance of the LVT NMOS transistors 513 and 523 may be reduced.

A signal at a node N52 is an inverted version of first data signal Data1. When the first data signal Data1 has a logical "0" value, only the LVT PMOS transistor 511 is turned on, so the signal at the node N52 may have a logical "1" value. When the first data signal Data1 has a logical "1" value, only the LVT NMOS transistor 512 is turned on, so the signal at the node N52 has a logical "0" value. The signal at the node N52 is transferred through the LVT NMOS transistor 513 to a node N55. The LVT NMOS transistor 513 is turned on and off according to the boosting clock signal CLKDB. Since threshold voltages of the LVT NMOS transistors 511, 512 and 513 are low, switching operations of the LVT NMOS transistors 511, 512, and 513 are fast. The signal at the node N52 is transferred to the node N55 according to a frequency of the boosting clock signal CLKDB.

Similarly, a signal at a node N54 is an inverted version of the second data signal Data2. When the second data signal Data2 has a logical "0" value, only the LVT PMOS transistor 521 is turned on, so the signal at the node N54 has a logical "1" value. When the second data signal Data2 has a logical "1" value, only the NMOS transistor 522 is turned on, so the signal at the node N54 has a logical "0" value. The signal at the node N54 is transferred through the LVT NMOS transistor 523 to the node N55. The LVT NMOS transistor 523 is turned on and off according to a boosting inversion clock signal CLKBDB. Since threshold voltages of the LVT NMOS transistors 521, 522 and 523 are low, the switching operations of the LVT NMOS transistors 521, 522 and 523 are fast. The signal at the node N54 is transferred to the node N55 according to a frequency of the boosting inversion clock signal CLKBDB A pulse waveform of the boosting clock signal CLKDB is opposite to that of the boosting inversion clock signal CLKBDB. Thus, the first data signal Data1 and the second data signal Data2 are multiplexed by the LVT NMOS transistor 513 and the NMOS transistor 523, providing a multiplexed output data signal DQ, which is output through an output pad 530. A frequency of the output data signal DQ may be equal to the frequency of the clock signals CLKDB and CLKBDB.

Transfer speeds of the first data signal Data1 and the second data signal Data2 are slower than those of the boosting clock signal CLKDB and the boosting inversion clock signal CLKBDB. For example, the first data signal Data1 and the second data signal Data2 may be transferred at a speed of about 3.2 Gbps, and the boosting clock signal CLKDB and the boosting inversion clock signal CLKBDB may be transferred at a speed of about 6.4 Gbps. The output circuit 500 may receive the first data signal Data1 and the second data signal Data2, and output the multiplexed output data signal DQ at about 6.4 Gbps. The output circuit 500 may multiplex the first data signal Data1 and the second data signal Data2 at a front stage of the output pad 530, so a high-speed transfer period of the output data signal DQ may be shortened. This may mean that the inter-symbol interference of the output data signal DQ is reduced.

Notably, in the above circuit diagrams, the transistors have been depicted as NMOS and PMOS transistors arranged in various configurations. However, it is understood that the types of transistors may vary, without departing from the scope of the present teachings.

Figure 8:
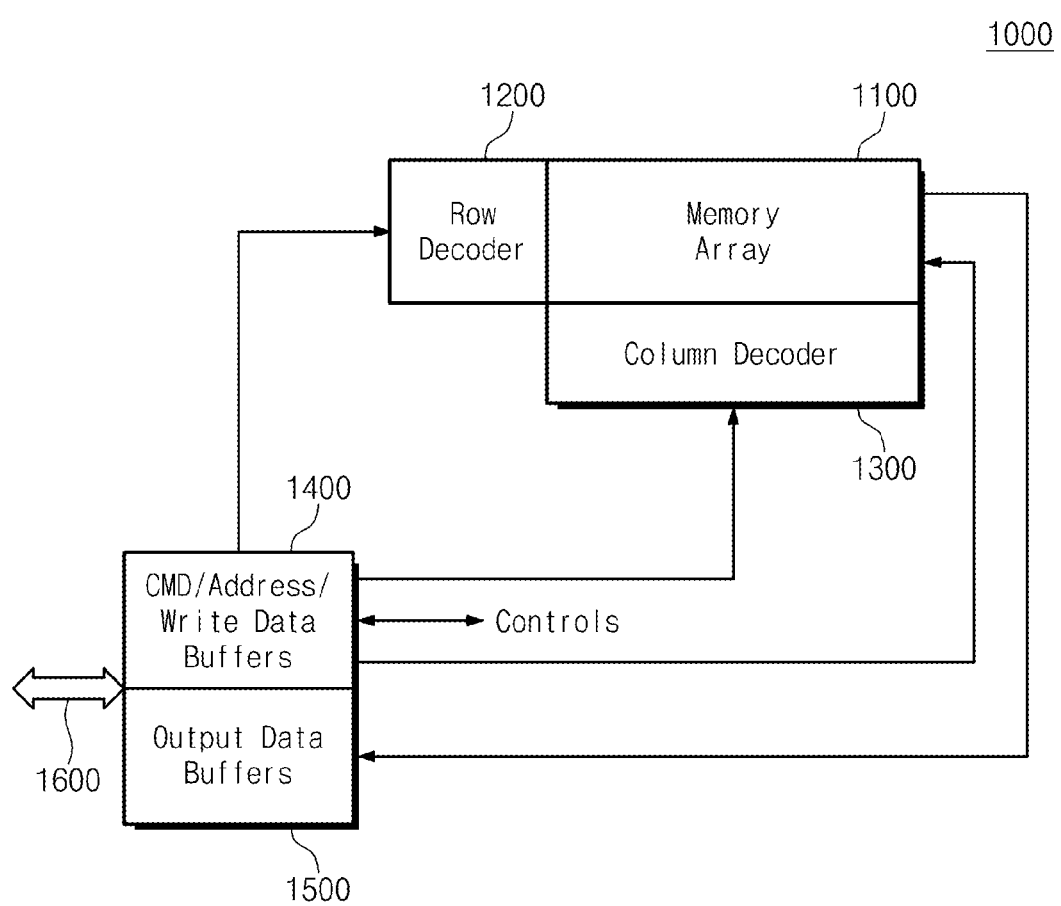
FIG. 8 is a block diagram schematically illustrating a semiconductor memory device using an output circuit, according to embodiments of the inventive concept.

FIG. 8 is a block diagram schematically illustrating a semiconductor memory device using an output circuit, according to embodiments of the inventive concept. Referring to FIG. 8, a semiconductor memory device 1000 includes a memory array 1100, a row decoder 1200, a column decoder 1300, command/address/write data buffers 1400, and output data buffers 1500.

The memory array 1100 may include multiple DRAM cells, SRAM cells, NAND-type EEPROM cells, NOR-type EEPROM cells, or other types of memory cells, for example. The command/address/write data buffers 1400 may buffer commands, addresses and write data. The row decoder 1200 may decode a row address to select a row of the memory array 1100. The column decoder 1300 may decode a column address to select a column of the memory array 1100. The output data buffers 1500 may buffer data output from the memory array 1100. During a read mode of operation, for example, the output data buffers 1500 may transfer output data to an input/output bus 1600.

The output data buffers 1500 may include an output circuit, such as output circuit 100, 400 and 500 (e.g., refer to FIGS. 2, 6 and 7), discussed above. In this case, the semiconductor memory device 1000 may perform high-speed data transfer operations. That is, the output circuit multiplexes low-speed data signals Data1 and Data2 at a front stage of output pad (130, 430 or 530) of the semiconductor memory device 1000 to output a high-speed output data signal DQ. Also, clock boosting circuits (200 and 300) (e.g., refer to FIG. 3), discussed above, may be used to provide the output circuit with clock signals CLKDB and CLKBDB boosted using boosting capacitors BC1 and BC2. Thus, the output circuit may perform fast multiplexing operations using the boosted clock signals CLKDB and CLKBDB.

Figure 9:
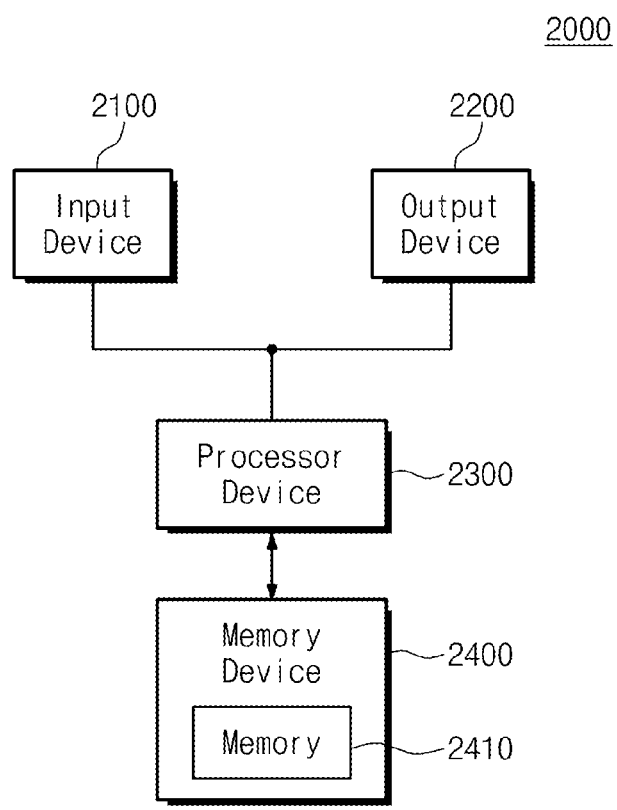
FIG. 9 is a block diagram schematically illustrating an application of an electronic system including an output circuit, according to embodiments of the inventive concept.

FIG. 9 is a block diagram schematically illustrating an application of an electronic system including an output circuit, according to an embodiment of the inventive concept. Referring to FIG. 9, an electronic system 2000 includes an input device 2100, an output device 2200, a processor device 2300 and a memory device 2400. The processor device 2300 may control the input device 2100, the output device 2200, and the memory device 2400 through corresponding interfaces.

In the depicted embodiment, the memory device 2400 has a memory 2410, which may include an output circuit, such as output circuit 100, 400 and 500 (e.g., refer to FIGS. 2, 6 and 7), discussed above. In this case, the memory device 2400 may perform high-speed data transfer operations. The output circuit may multiplex low-speed data signals Data1 and Data2 at a front stage of an output pad (130, 430 or 530) of the memory device 2400 to output a high-speed output data signal DQ. Also, clock boosting circuits (200 and 300) (e.g., refer to FIG. 3) may provide the output circuit with clock signals CLKDB and CLKBDB boosted using boosting capacitors BC1 and BC2. The output circuit may perform a fast multiplexing operation using the boosted clock signals CLKDB and CLKBDB.

Figure 10:
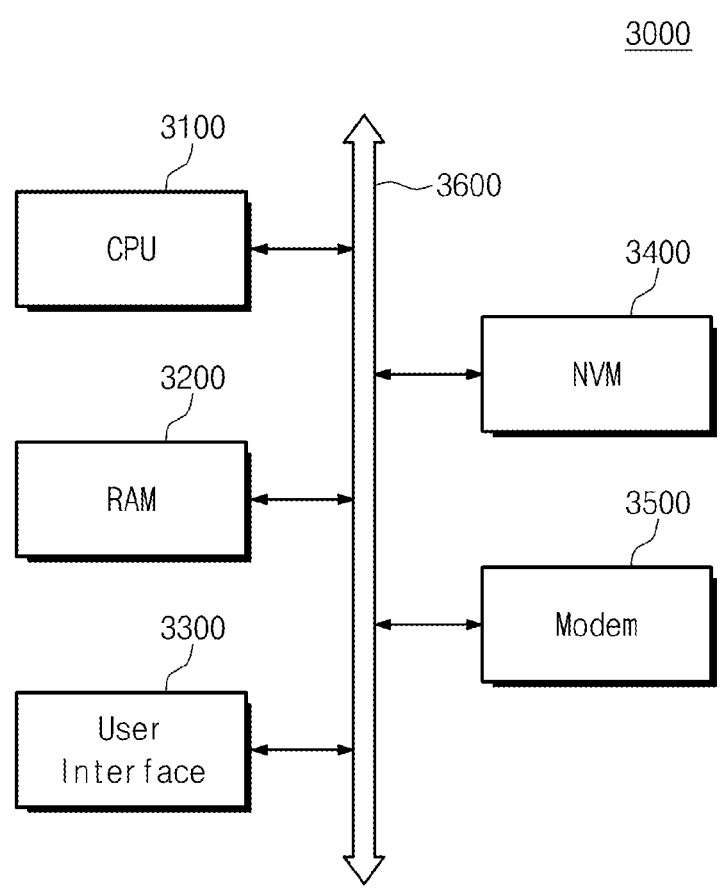
FIG. 10 is a block diagram schematically illustrating a computing system including RAM and a nonvolatile memory device having an output circuit, according to embodiments of the inventive concept.

FIG. 10 is a block diagram schematically illustrating a computing system including RAM and a nonvolatile memory device having an output circuit, according to embodiments of the inventive concept. A computing system 3000 may include a central processing unit (CPU) 3100, RAM 3200, a user interface 3300, a modem 3500 (such as a baseband chipset), and a nonvolatile memory device 3400, which are electrically connected to a system bus 3600.

If the computing system 3000 is a mobile device, it may further comprise a battery (not shown) for supplying an operation voltage. Although not shown, the computing system 3000 may further comprise an application chipset, a camera image processor (CIP), a mobile RAM, and the like.

The RAM 3200 and/or the nonvolatile memory device 3400 may include an output circuit, such as output circuit 100, 400 and 500 (e.g., refer to FIGS. 2, 6 and 7), discussed above. In this case, the RAM 3200 and/or the nonvolatile memory device 3400 may perform high-speed data transfer operations. The output circuit may multiplex low-speed data signals Data1 and Data2 at a front stage of an output pad (130, 430 or 530) of the RAM 3200 and/or the nonvolatile memory device 3400 to output a high-speed output data signal DQ. Also, clock boosting circuits (200 and 300) (e.g., refer to FIG. 3) may provide the output circuit 100 with clock signals CLKDB and CLKBDB boosted using boosting capacitors BC1 and BC2. The output circuit may perform a fast multiplexing operation using the clock signals CLKDB and CLKBDB boosted.

Figure 11:
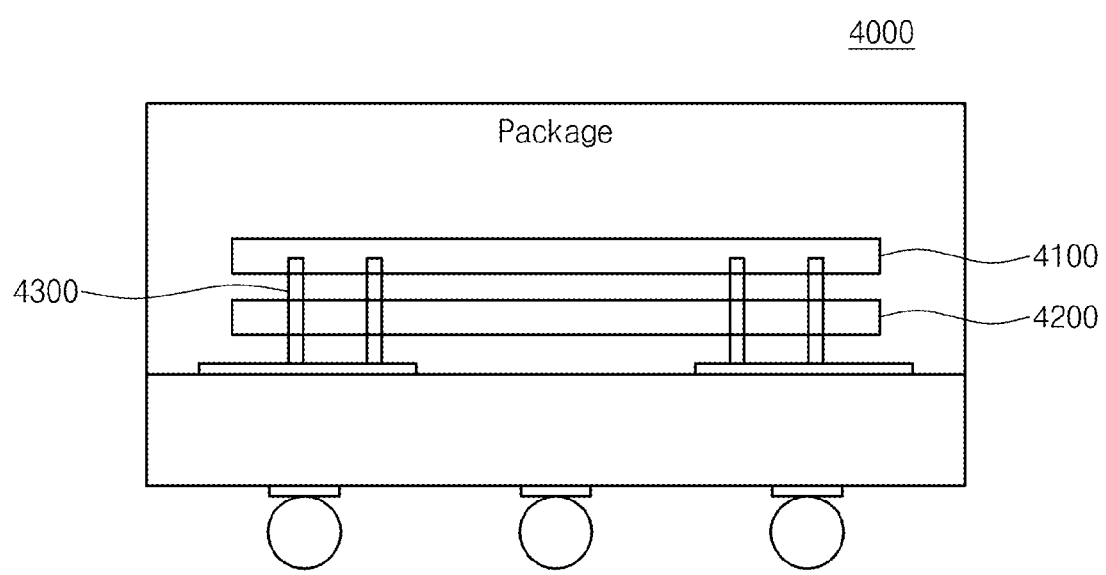
FIG. 11 is a cross-sectional view of a computing system including an output circuit, according to embodiments of the inventive concept.

FIG. 11 is a cross-sectional view of a computing system including an output circuit, according to embodiments of the inventive concept. Referring to FIG. 11, a computing system 4000 include a first device 4100 and a second device 4200.

The first device 4100 and the second device 4200 may perform data transmission and reception through a channel. The first device 4100 and the second device 4200 may be mounted using a package such as PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flatpack), SOIC (Small Outline Integrated Circuit), SSOP (Shrink Small Outline Package), TSOP (Thin Small Outline), SIP (System In Package), MCP (Multi Chip Package), WFP (Wafer-level Fabricated Package), WSP (Wafer-Level Processed Stack Package), or the like.

The first device 4100 and the second device 4200 may be implemented by different chips. The first device 4100 and the second device 4200 may b e connected through a vertical electrical connection, that is, a via. For example, the via may be a through silicon via (TSV).

The first device 4100 and the second device 4200 may include an output circuit, such as output circuit 100, 400 and 500 (e.g., refer to FIGS. 2, 6 and 7), discussed above. In this case, the first device 4100 and the second device 4200 may perform high-speed data transfer operations. The output circuit may multiplex low-speed data signals Data1 and Data2 at a front stage of an output pad (130, 430 or 530) of the first device 4100 and the second device 4200 to output a high-speed output data signal DQ. Also, clock boosting circuits (200 and 300) (e.g., refer to FIG. 3) may provide the output circuit with clock signals CLKDB and CLKBDB boosted using boosting capacitors BC1 and BC2. The output circuit may perform a fast multiplexing operation using the clock signals CLKDB and CLKBDB boosted.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An output circuit, comprising:
    a first output driver configured to transfer a first data signal directly to an output pad in synchronization with a clock signal; and
    a second output driver configured to transfer a second data signal directly to the output pad in synchronization with an inversion clock signal,
    wherein the clock signal and the inversion clock signal enable multiplexing of the first data signal and the second data signal to provide a multiplexed output data signal.

2. The output circuit of claim 1, wherein each of the first data signal and the second data signal has a transfer frequency lower than a frequency of each of the clock signal and the inversion clock signal, respectively.

3. The output circuit of claim 1, wherein the first output driver comprises a first transistor configured to transfer the first data signal to the output pad in synchronization with the clock signal, and
    wherein the second output driver comprises a second transistor configured to transfer the second data signal to the output pad in synchronization with the inversion clock signal.

4. The output circuit of claim 3, wherein the first and second transistors multiplex the first data signal and the second data signal in synchronization with the clock signal and the inversion clock signal.

5. The output circuit of claim 3, wherein each of the first and second transistors comprise an NMOS transistor.

6. The output circuit of claim 1, wherein the first output driver comprises:
    a first low voltage threshold (LVT) NMOS transistor configured to be turned on and off according to the clock signal;
    a PMOS transistor configured to be selectively turned on according to the first data signal to transfer a power supply voltage to the first LVT NMOS transistor; and
    an NMOS transistor configured to be selectively turned on according to the first data signal to transfer a ground voltage to the first LVT NMOS transistor,
    wherein the first LVT NMOS transistor comprises a source, connected to a drain of the PMOS transistor and a drain of the NMOS transistor, and a drain connected to the output pad.

7. The output circuit of claim 6, wherein a threshold voltage of the first LVT NMOS transistor is lower than a threshold voltage of the NMOS transistor.

8. The output circuit of claim 1, wherein the second output driver comprises:
    a second LVT NMOS transistor configured to be turned on and off according to the inversion clock signal;
    a PMOS transistor configured to be selectively turned on according to the second data signal to transfer a power supply voltage to the second LVT NMOS transistor; and
    an NMOS transistor configured to be selectively turned on according to the second data signal to transfer a ground voltage to the second LVT NMOS transistor,
    wherein the second LVT NMOS transistor comprises a source, connected to a drain of the PMOS transistor and a drain of the NMOS transistor, and a drain connected to the output pad.

9. The output circuit of claim 8, wherein a threshold voltage of the second LVT NMOS transistor is lower than a threshold voltage of the NMOS transistor.

10. An output circuit, comprising:
    a first output driver configured to transfer a first data signal directly to an output pad in synchronization with a boosting clock signal;
    a second output driver configured to transfer a second data signal directly to the output pad in synchronization with a boosting inversion clock signal;
    a first clock boosting circuit configured to convert a clock signal into the boosting clock signal using a first boosting capacitor; and
    a second clock boosting circuit configured to convert an inversion clock signal into the boosting inversion clock signal using a second boosting capacitor,
    wherein the boosting clock signal and the boosting inversion clock signal enable multiplexing of the first data signal and the second data signal to provide a multiplexed output data signal.

11. The output circuit of claim 10, wherein the first clock boosting circuit comprises a first NMOS transistor connected in parallel with the first boosting capacitor, and
    wherein the boosting clock signal is boosted to be higher than the clock signal by a threshold voltage of the first NMOS transistor.

12. The output circuit of claim 11, wherein the first NMOS transistor has a source connected to a node of the first boosting capacitor to which the clock signal is provided and a gate and a drain connected to a node of the first boosting capacitor from which the boosting clock signal is output.

13. The output circuit of claim 11, wherein the second clock boosting circuit comprises a second NMOS transistor connected in parallel with the second boosting capacitor, and
    wherein the boosting inversion clock signal is boosted to be higher than the inversion clock signal by a threshold voltage of the second NMOS transistor.

14. The output circuit of claim 13, wherein the second NMOS transistor has a source connected to a node of the second boosting capacitor to which the inversion clock signal is provided and a gate and a drain connected to a node of the second boosting capacitor from which the boosting inversion clock signal is output.

15. The output circuit of claim 10, wherein each of the first data signal and the second data signal has a transfer frequency lower than a frequency of each of the boosting clock signal and the boosting inversion clock signal, respectively.

16. The output circuit of claim 13, wherein the first output driver comprises a first low voltage threshold (LVT) NMOS transistor configured to transfer the first data signal to the output pad in synchronization with the boosting clock signal, and
    wherein the second output driver comprises a second LVT NMOS transistor configured to transfer the second data signal to the output pad in synchronization with the boosting inversion clock signal.

17. An output circuit, comprising:
    a first output driver comprising:
        a first transistor configured to be turned on and off according to a clock signal;
        a second transistor configured to selectively transfer a first voltage to the first transistor according to a first data signal; and a third transistor configured to selectively transfer a second voltage to the first transistor according to the first data signal; and a second output driver comprising:
  a fourth transistor configured to be turned on and off according to an inversion clock signal;
  a fifth transistor configured to selectively transfer the first voltage to the fourth transistor according to a second data signal; and
  a sixth transistor configured to selectively transfer the second voltage to the fourth transistor according to the second data signal,
wherein outputs of the first and fourth transistors are connected to provide a multiplexed output data signal comprising the first and second data signals.

18. The output circuit of claim 17, wherein each of the first and second data signals has a transfer frequency lower than a frequency of each of the clock signal and the inversion clock signal, respectively.

19. The output circuit of claim 18, further comprising:

an output pad connected to the first and fourth transistors and configured to receive the multiplexed output data signal, the output pad enabling connection to another device.

20. The output circuit of claim 18, further comprising:

a first clock boosting circuit configured to convert the clock signal into a boosting clock signal using a first boosting capacitor; and a second clock boosting circuit configured to convert the inversion clock signal into a boosting inversion clock signal using a second boosting capacitor, wherein the first and fourth transistors are configured to be turned on and off according to the boosting clock signal and the boosting inversion clock signal, respectively.

* * * * *